United States Patent [19]

Cowley

[11] Patent Number: 5,010,308
[45] Date of Patent: Apr. 23, 1991

[54] CRYSTAL OSCILLATOR WITH OFFSET AND HYSTERESIS

[75] Inventor: Nicholas P. Cowley, Wroughton, United Kingdom

[73] Assignee: Plessey Overseas Limited, Ilford, England

[21] Appl. No.: 438,453

[22] PCT Filed: Apr. 20, 1989

[86] PCT No.: PCT/GB89/00420
§ 371 Date: Mar. 7, 1990
§ 102(e) Date: Mar. 7, 1990

[87] PCT Pub. No.: WO89/11180
PCT Pub. Date: Nov. 16, 1989

[30] Foreign Application Priority Data

May 11, 1988 [GB] United Kingdom ............... 8811193

[51] Int. Cl.$^5$ .............................................. H03B 5/36
[52] U.S. Cl. .................................. 331/116 R; 331/45; 331/60; 331/75; 331/159
[58] Field of Search ............. 331/116 R, 116 FE, 159, 331/25, 158, 45, 60, 74, 75

[56] References Cited

U.S. PATENT DOCUMENTS

| | | | |
|---|---|---|---|
| 3,824,491 | 7/1974 | Treadway | 331/116 R X |
| 4,128,817 | 12/1978 | Gomi | 331/116 R X |
| 4,234,858 | 11/1980 | Gomi | 331/116 R X |
| 4,587,500 | 5/1986 | Tanaka et al. | 333/213 |

OTHER PUBLICATIONS

Evans, "Crystal Oscillator", IBM Technical Disclosure Bulletin, vol. 9, No. 2, Jul. 1966.

*Primary Examiner*—Siegfried H. Grimm
*Attorney, Agent, or Firm*—Fleit, Jacobson, Cohn, Price, Holman & Stern

[57] ABSTRACT

An oscillator is provided with an internal, high gain hysteresis effect so as to offset the linear regions of the waveform and to avoid spikes upsetting the count of a reference divider controlling the oscillator. The crystal (10) and capacitor (11) are connected between the base of one ($T_1$) and the collector of the other ($T_2$) transistor of a long-tailed pair, signals appearing at the collector thereof being fed via emitter followers ($T_5$, $T_6$) to a further long-tailed pair ($T_7$, $T_8$) having tapped collector resistors ($R_1$, $R_2$). The signal appearing at the tapping point of one of the further pair ($T_7$) is fed to the base of a transistor ($T_3$) whose collector-emitter resistor lies in the load circuit of one of the transistors ($T_1$) of the first long-tailed pair.

3 Claims, 3 Drawing Sheets

CRYSTAL OSCILLATOR WITH OFFSET AND HYSTERESIS

This invention relates to oscillators particularly reference oscillators for use in phase locked loops.

There is a requirement for oscillators capable of providing a clean, well balanced stable output frequency for use in phase locked loops to control, for example, the frequency of some other local oscillator the output of which is mixed with a received signal in a tuner to provide an appropriate intermediate frequency.

Figure 1:
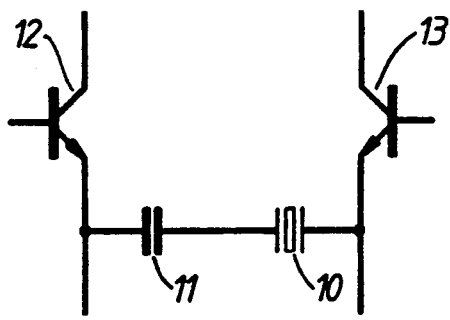
Figure 2:
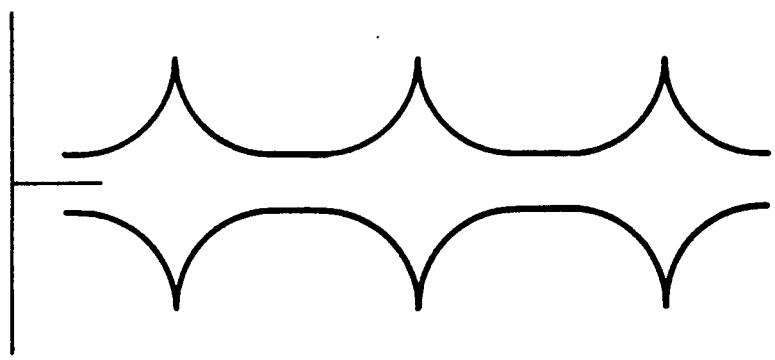

Conventionally, a crystal oscillator has been used to provide a reference oscillator due to the inherent stability of the crystal. A simple circuit is shown in FIG. 1 in which the crystal 10 and a tuning capacitor 11 are connected between the emitters of a pair of transistors 12, 13 to the respective bases of which an input signal is differentially fed. The output of such a circuit, taken from the collectors of the transistors 12, 13 is shown in FIG. 2. The output comprises asymmetric signals and is rich in harmonics. If such a reference oscillator, operating at, for example, 4 MHz, is for use in a television tuner having an intermediate frequency of, for example, 39 MHz and a bandwidth of 6 MHz, the 9th, 10th and 11th harmonic of the output of the reference oscillator may appear on the I. F. signal and cause patterning on the video display.

Figure 3:
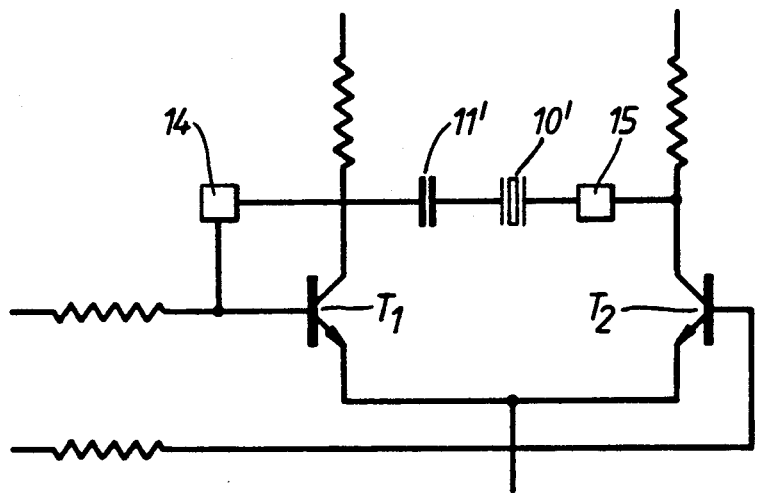
Figure 4:
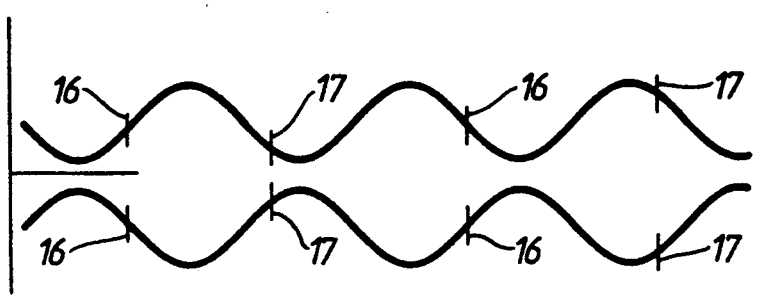

FIG. 3 shows a better circuit for a reference oscillator. The circuit provides a linear sinusoidal output. In this form, the crystal $10'$ is connected between the collector of one transistor $T_1$ of a differential pair $T_1$ and $T_2$ and the base of the transistor $T_2$. Bond pads 14, 15 permit external components such as the crystal $10'$ and capacitor $11'$ to be connected to the circuit. The output of such an oscillator, again taken from the collectors is shown in FIG. 4. It is well balanced and has much lower radiation levels but is of low gain at the oscillation frequency. However, present in a digital TV tuner are data signals. These are square wave signals at a frequency of approximately 100 KHz and have very fast rise times giving rise to radiation which appears as spikes on the output of the oscillator. Such spikes 16 and 17 are shown in FIG. 4. If the spikes (spikes 16) occur on the linear portions of the output, problems arise in a divider normally provided downstream of the reference oscillator. Spikes 17 have little effect. The spikes 16 cause misdivision, the phase locked loop becomes astable and hence control of the loop by the reference oscillator becomes difficult.

It is an object of the present invention to provide an oscillator wherein the aforesaid disadvantages are minimized or obviated.

According to the present invention, there is provided a crystal oscillator comprising a pair of differentially arranged transistors to the bases of which an input signal may be differentially applied, a crystal and a capacitor being connectable between the collector of a first of the transistors and the base of a second of the transistors, the oscillator outputs being provided differentially on the collectors of the first and second transistors, and a feedback loop established by an output of one of the transistors serving to drive a further transistor connected as a load in the collector of the other of the transistors.

Figure 5:
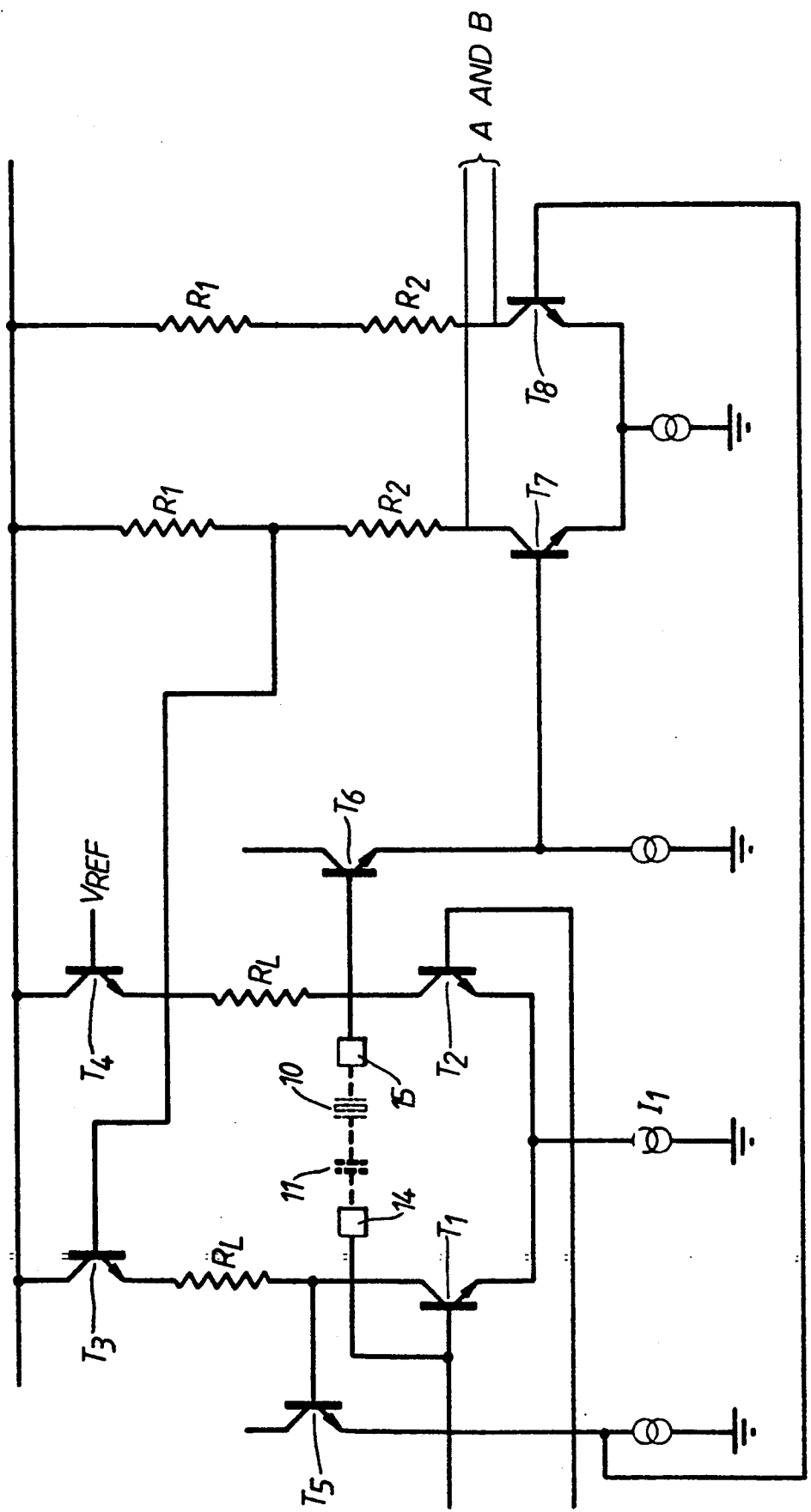
Figure 6:
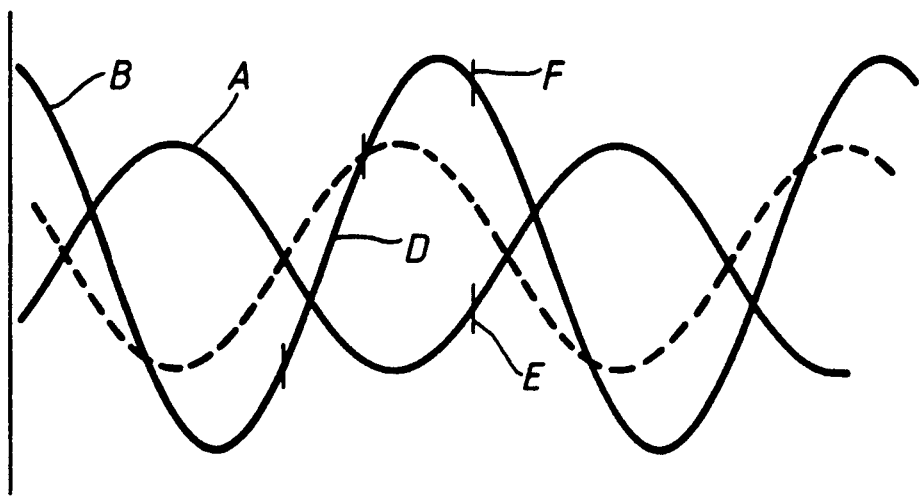
Figure 5:
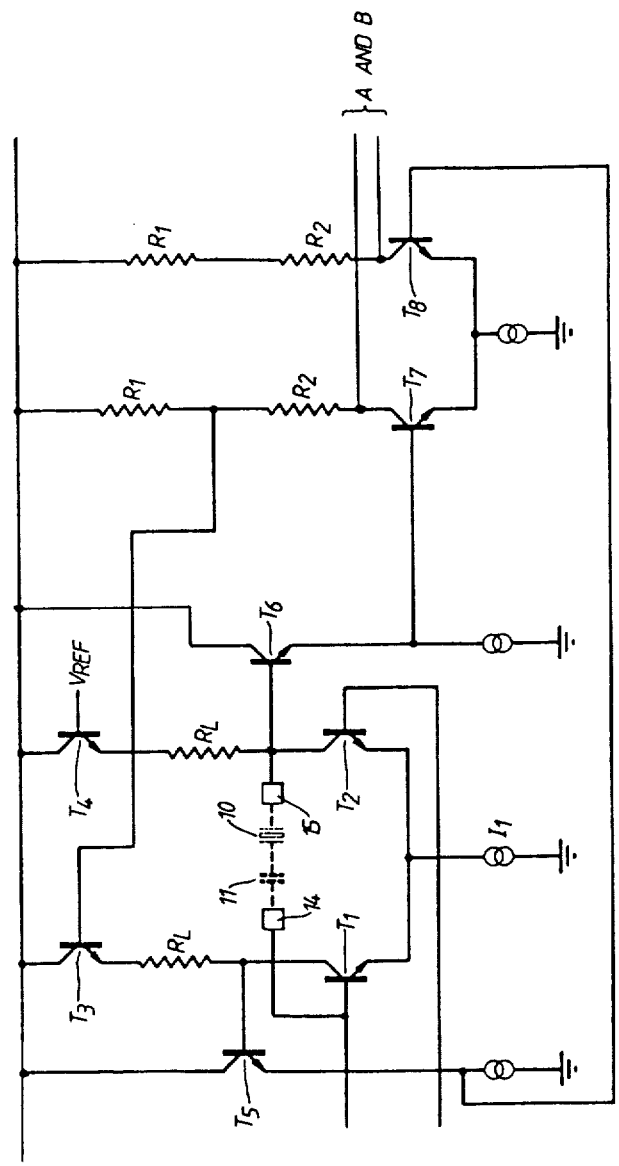

The invention will be described further, by way of example, with reference to the accompanying drawings, in which:

FIGS. 1 to 4, as hereinbefore described, relate to known oscillators;

FIG. 5 is a circuit diagram of an oscillator constructed in accordance with the present invention; and FIG. 6 is a graphical representation of the output of the oscillator shown in FIG. 5.

Referring to FIGS. 5 and 6, an oscillator in accordance with the present invention comprises a differential pair of NPN transistors $T_1$, $T_2$ having external components, a crystal 10 and a capacitor 11 (shown in broken lines), coupled via bond pads 14, 15 between the collector of transistor $T_2$ and the base of transistor $T_1$.

An input signal is provided to the bases of transistors $T_1$ and $T_2$. The emitters of the transistors $T_1$ and $T_2$ are coupled to a current source $I_1$. Load resistors $R_L$ are provided in the collector loads of the transistors $T_1$ and $T_2$ as also are transistors $T_3$ and $T_4$ (to be described later). Outputs from the oscillator are taken from the collectors of transistors $T_1$ and $T_2$. The outputs are buffered through respective emitter follower transistors $T_5$ and $T_6$ and applied to the bases of a differential amplifier formed by emitter coupled transistors $T_7$ and $T_8$. The outputs of the oscillator are taken below serial load resistors $R_1$ and $R_2$ in each of the collector leads of the transistors $T_7$ and $T_8$.

Excepting the transistors $T_3$ and $T_4$, the oscillator so far described operates identically to that described in relation to FIG. 2 and would suffer similar defects.

In accordance with the present invention, the transistors $T_3$ and $T_4$ are included in the collector leads of the respective transistors $T_1$ and $T_2$. Transistor $T_4$ has its base biased by a applied voltage $V_{REF}$. Transistor $T_3$ has its base driven by a feedback loop taken from the junction between resistors $R_1$ and $R_2$ in the collector lead of the output transistor $T_7$. The effect of the inclusion of the so-driven transistors $T_3$ and $T_4$ is to introduce offset and hysteresis into the outputs.

As shown in FIG. 6 which is a graphical representation of the differential outputs, one output, output A, is substantially identical to the corresponding output shown in FIG. 4 although a greater or lesser degree of offset may, if desired by introduced thereto. The other output, output B, that having hysteresis, has its output waveform modified to a greater extent. The modification to the output waveform B caused by the hysteresis is such that it lags slightly behind the unmodified output C (shown dotted) and has a greater amplitude. The increased amplitude is occasioned by a much steeper slope over its linear region as exemplified. The overall effect is that crossovers are displaced towards or at ends of the linear regions so that a spike E on the linear region of one waveform is matched by a corresponding spike F on a non-linear portion of the other waveform and is therefore much less discernable in following stages.

In use, it is intended that the oscillator of the present invention shoul be employed as a reference oscillator forming part of a phase locked loop of a frequency synthesizer. Such an arrangement has utility for example in the tuner stage of a television receiver. The oscillator is usually followed by a reference divider, the output of which is fed to a phase comparator to which is also fed the appropriately divided output of a local oscillator for comparison. Phase errors produce signals which are used to increase or decrease the output frequency of the local oscillator thus forming a phase locked loop. The local oscillator may produce its signal for mixing with a received signal to form an intermediate frequency signal for subsequent processing.

The reference oscillator according to the present invention has a greater immunity to spikes and hence to misdivision by the reference divider due to such spikes. Stability of the loop and of the output frequency of the local oscillator is consequently improved.

The invention is not confined to the precise details of the foregoing example and variations may be made thereto. For instance, the degree of offset and/or of hysteresis of one output relative to the other may readily be varied by the reference voltage applied to the base of transistor $T_4$ and by the ratio of the resistances $R_1$ and $R_2$ in the collector of transistor $T_7$.

A feedback loop, to cause the hysteresis may be established from an appropriately loaded collector of the buffer emitter follower transistor $T_6$.

While the crystal 10 and capacitor 11 have been shown as offchip components, the capacitor 11 at least may be fabricated on chip. The use of NPN transistors throughout facilitates the fabrication of the oscillator on a silicon chip using standard techniques. It will be appreciated that PNP or mixed, NPN, PNP transistors may be used in the oscillator of the invention, current sources being replaced by sinks as necessary.

Other variations are possible within the scope of the present invention.

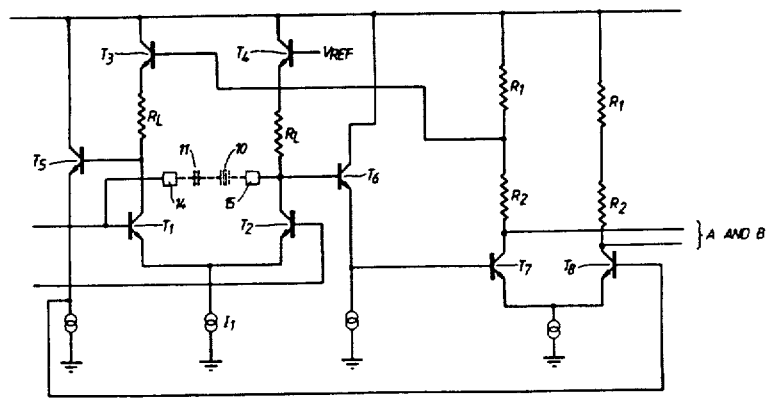

I claim:

1. A crystal oscillator comprising a pair of differentially arranged transistors to the bases of which an input signal may be differentially applied, a crystal and a capacitor being connectable between the collector of a first of the transistors and the base of a second of the transistors, the oscillator outputs being provided differentially on the collectors of the first and second transistors, and a feedback loop established by an output of one of the transistors serving to drive a further transistor connected as a load in the collector of the other of the transistors.

2. An oscillator as claimed in claim 1 wherein the outputs are buffered by respective emitter followers and applied differentially to a differential amplifier.

3. An oscillator as claimed in claim 2 comprising a split resistive load in each of the outputs of the differential amplifier from the junction of one of which is taken the drive for the further transistor.

* * * * *

UNITED STATES PATENT AND TRADEMARK OFFICE
CERTIFICATE OF CORRECTION

PATENT NO. : 5,010,308
DATED : April 23, 1991      Page 1 of 3
INVENTOR(S) : COWLEY It is certified that error appears in the above-identified patent and that said Letters Patent is hereby corrected as shown below:

The Title page should be deleted to appear as per attached.

Please replace drawing sheet 2 of 3 with the attached drawing sheet. (Figure 5)

Signed and Sealed this

Fifteenth Day of December, 1992

*Attest:*

DOUGLAS B. COMER

*Attesting Officer*     Acting Commissioner of Patents and Trademarks

United States Patent [19]

Cowley

[11] Patent Number: 5,010,308
[45] Date of Patent: Apr. 23, 1991

[54] CRYSTAL OSCILLATOR WITH OFFSET AND HYSTERESIS

[75] Inventor: Nicholas P. Cowley, Wroughton, United Kingdom

[73] Assignee: Plessey Overseas Limited, Ilford, England

[21] Appl. No.: 438,453

[22] PCT Filed: Apr. 20, 1989

[86] PCT No.: PCT/GB89/00420
§ 371 Date: Mar. 7, 1990
§ 102(e) Date: Mar. 7, 1990

[87] PCT Pub. No.: WO89/11180
PCT Pub. Date: Nov. 16, 1989

[30] Foreign Application Priority Data

May 11, 1988 [GB] United Kingdom ............... 8811193

[51] Int. Cl.$^5$ ........................................... H03B 5/36
[52] U.S. Cl. .............................. 331/116 R; 331/45; 331/60; 331/75; 331/159
[58] Field of Search ............ 331/116 R, 116 FE, 159, 331/25, 158, 45, 60, 74, 75

[56] References Cited

U.S. PATENT DOCUMENTS

| | | |
|---|---|---|
| 3,824,491 | 7/1974 | Treadway .................. 331/116 R X |
| 4,128,817 | 12/1978 | Gomi ........................ 331/116 R X |
| 4,234,858 | 11/1980 | Gomi ........................ 331/116 R X |
| 4,587,500 | 5/1986 | Tanaka et al. ..................... 333/213 |

OTHER PUBLICATIONS

Evans, "Crystal Oscillator", IBM Technical Disclosure Bulletin, vol. 9, No. 2, Jul. 1966.

Primary Examiner—Siegfried H. Grimm
Attorney, Agent, or Firm—Fleit, Jacobson, Cohn, Price, Holman & Stern

[57] ABSTRACT

An oscillator is provided with an internal, high gain hysteresis effect so as to offset the linear regions of the waveform and to avoid spikes upsetting the count of a reference divider controlling the oscillator. The crystal (10) and capacitor (11) are connected between the base of one ($T_1$) and the collector of the other ($T_2$) transistor of a long-tailed pair, signals appearing at the collector thereof being fed via emitter followers ($T_5$, $T_6$) to a further long-tailed pair ($T_7$, $T_8$) having tapped collector resistors ($R_1$, $R_2$). The signal appearing at the tapping point of one of the further pair ($T_7$) is fed to the base of a transistor ($T_3$) whose collector-emitter resistor lies in the load circuit of one of the transistors ($T_1$) of the first long-tailed pair.

3 Claims, 3 Drawing Sheets